US010355302B2

(12) United States Patent
Lethien et al.

(10) Patent No.: US 10,355,302 B2
(45) Date of Patent: Jul. 16, 2019

(54) MICROSTRUCTURED SUBSTRATE

(71) Applicants: CENTRE NATIONAL DE LA RECHERCHE SCIENTIFIQUE, Paris (FR); UNIVERSITE DE NANTES, Nantes (FR)

(72) Inventors: Christophe Lethien, Violaines (FR); Pascal Tilmant, Lomme (FR); Etienne Eustache, Lille (FR); Nathalie Rolland, Villeneuve d'Ascq (FR); Thierry Brousse, La Chapelle sur Erdre (FR)

(73) Assignees: CENTRE NATIONAL DE LA RECHERCHE SCIENTIFIQUE, Paris (FR); UNIVERSITE DE NANTES, Nantes (FR)

( * ) Notice: Subject to any disclaimer, the term of this patent is extended or adjusted under 35 U.S.C. 154(b) by 114 days.

(21) Appl. No.: 15/027,065

(22) PCT Filed: Oct. 2, 2014

(86) PCT No.: PCT/FR2014/052505
§ 371 (c)(1),
(2) Date: Apr. 4, 2016

(87) PCT Pub. No.: WO2015/052412
PCT Pub. Date: Apr. 16, 2015

(65) Prior Publication Data
US 2016/0240882 A1    Aug. 18, 2016

(30) Foreign Application Priority Data
Oct. 7, 2013  (FR) .................... 13 59717

(51) Int. Cl.
*H01M 10/02*       (2006.01)
*B81B 1/00*        (2006.01)
(Continued)

(52) U.S. Cl.
CPC ............ *H01M 10/02* (2013.01); *B81B 1/002* (2013.01); *B81C 1/00047* (2013.01);
(Continued)

(58) Field of Classification Search
CPC ............ B81B 1/002; B81B 2203/0315; B81B 2203/0361; B81C 1/00047;
(Continued)

(56) References Cited

U.S. PATENT DOCUMENTS

2004/0171274 A1    9/2004   Zhuang et al.
2007/0128875 A1    6/2007   Jessing
(Continued)

FOREIGN PATENT DOCUMENTS

JP    H 0989840       4/1997
JP    2005353758     12/2005
(Continued)

OTHER PUBLICATIONS

Nguyen et al., "Alumina-coated silicon-based nanowire arrays for high quality Li-ion battery anodes," Journal of Materials Chemistry, 2012, 22, 24618-24626. (Year: 2012).*
(Continued)

*Primary Examiner* — Ula C Ruddock
*Assistant Examiner* — Matthew W Van Oudenaren
(74) *Attorney, Agent, or Firm* — Ipsilon USA, LLP

(57) ABSTRACT

A microstructured substrate includes a plurality of at least one elementary microstructure. An electrical storage device, and more particularly an all-solid-state battery, can include the microstructured substrate.

15 Claims, 8 Drawing Sheets

(51) Int. Cl.
*B81C 1/00* (2006.01)
*H01M 10/0585* (2010.01)
*H01M 10/04* (2006.01)
*H01G 11/70* (2013.01)
*H01M 10/052* (2010.01)
*H01M 6/40* (2006.01)

(52) U.S. Cl.
CPC .......... *B81C 1/00111* (2013.01); *H01G 11/70* (2013.01); *H01M 10/0436* (2013.01); *H01M 10/0585* (2013.01); *B81B 2203/0315* (2013.01); *B81B 2203/0361* (2013.01); *B81C 2201/013* (2013.01); *B81C 2201/0112* (2013.01); *B81C 2201/0159* (2013.01); *H01M 6/40* (2013.01); *H01M 10/052* (2013.01); *H01M 2220/30* (2013.01); *Y02E 60/13* (2013.01)

(58) Field of Classification Search
CPC ......... B81C 1/00111; B81C 2201/0112; B81C 2201/013; B81C 2201/0159; H01M 10/02; H01M 10/0436; H01M 10/052; H01M 10/0585; H01M 2220/30; H01M 6/40
See application file for complete search history.

(56) References Cited

U.S. PATENT DOCUMENTS

| | | | |
|---|---|---|---|
| 2008/0241689 A1* | 10/2008 | Takami | B60K 6/28 429/220 |
| 2010/0190051 A1* | 7/2010 | Aitken | H01M 2/1061 429/162 |
| 2010/0213579 A1 | 8/2010 | Henry et al. | |
| 2011/0033974 A1 | 2/2011 | Wang et al. | |
| 2013/0071751 A1* | 3/2013 | Tajima | H01G 11/26 429/231.8 |
| 2013/0143408 A1 | 6/2013 | Rantala et al. | |
| 2013/0149605 A1 | 6/2013 | Kakehata et al. | |
| 2014/0099539 A1* | 4/2014 | Yamazaki | H01M 4/386 429/211 |

FOREIGN PATENT DOCUMENTS

| | | |
|---|---|---|
| JP | 2010524164 | 7/2010 |
| JP | 2010175482 | 8/2010 |
| JP | 201377562 | 4/2013 |
| JP | 201384588 | 5/2013 |
| WO | 2008056190 | 5/2008 |

OTHER PUBLICATIONS

Search Report dated 2015.

* cited by examiner

MICROSTRUCTURED SUBSTRATE

RELATED APPLICATIONS

This application is a National Phase Application of PCT/FR2014/052505, filed on Oct. 2, 2014, which in turn claims the benefit of priority from French Patent Application No. 13 59717 filed on Oct. 7, 2013, the entirety of which are incorporated herein by reference.

BACKGROUND

Field of the Invention

The present invention relates to a microstructured substrate including a plurality of at least one elementary microstructure and to the process for manufacturing said microstructured substrate.

The present invention also relates to the use of such a substrate in the manufacture of a device for storing electrical energy including the microstructured substrate according to the invention. The microstructured substrate according to the invention is for example particularly advantageous in the manufacture of electrochemical batteries (such as all-solid-state batteries), or capacitors (such as electrostatic capacitors, electrolytic capacitors, supercapacitors, etc.). The microstructured substrate according to the invention is more particularly advantageous as regards the manufacture of devices for storing electrical energy that are micron-sized (i.e. between $10^{-6}$ and $10^{-3}$ m in size) or even millimeter-sized or centimeter-sized and able for example to be placed on an integrated circuit.

Description of Related Art

The substrates are for example made from semiconductors or dielectrics and generally take the form of thin discs (also called wafers) that are used as carriers in the manufacture of microstructures and/or systems of nanoscale or micron-sized dimensions.

These microstructures may for example be manufactured by one or more of the following techniques: chemical or physical etching, the growth of nano/micro structures, electrodeposition of materials inside micron-sized/nanoscale moulds followed by dissolution of the mould, etc.

Specifically, initially a substrate has a planar surface corresponding to a two-dimensional topology. However, depending on the destination of the substrate, it may prove to be advantageous to microstructure the surface of the substrate so that the latter has a three-dimensional topology.

Thus, a microstructured substrate has a larger specific surface area than a planar (i.e. non-microstructured) substrate.

The surface area of a substrate may for example be increased by producing microstructures having a high aspect ratio on the surface of said substrate. The aspect ratio of a microstructure for example corresponds to the ratio of its longitudinal dimension to its smallest transverse dimension (for example the smallest transverse distance between two microstructures placed consecutively on the substrate).

Specifically, a microstructured substrate for example allows a larger amount of materials to be deposited on its surface and more particularly on the lateral surfaces of the microstructures.

This may for example improve the performance of a device for storing electrical energy, increase the number of components integratable into a substrate, etc.

OBJECTS AND SUMMARY

There is therefore a need for structured substrates having an improved specific surface area relative to prior-art structured substrates, because specific surface area for example influences the performance of all-solid-state batteries.

Microstructures such as trenches, pillars and channels are known, but have the drawbacks of being mechanically fragile and/or of not sufficiently increasing the surface area of the substrate relative to the surface area of a planar substrate.

The first subject of the present invention is therefore a new type of microstructured substrate including a plurality of at least one elementary microstructure, characterized in that said at least one elementary microstructure, on the one hand, has an elongate shape and lower and upper opposite longitudinal ends, the lower end being connected to the substrate and, on the other hand, includes an open cavity at its upper end, said microstructured substrate comprising alumina on its surface.

This alumina layer at least partially fills the scallops produced by the process for obtaining the microstructured substrate according to the invention in order to facilitate the subsequent deposition of other materials on the surface of the microstructured substrate and to electrically insulate the microstructured substrate according to the invention.

The open cavity at the upper end of the elementary microstructure allows the surface area of the substrate to be increased. It will be noted that the surface area of the substrate is more greatly increased than with prior-art microstructures taking the form of wires or pillars.

According to one possible feature, the elementary microstructure has a circular, elliptical, rectangular, square or triangular transverse cross section.

It will be noted that a microstructure with a rectangular or more particularly square cross section is advantageous because the latter increases the surface area of the substrate more greatly than microstructures having a cross section of another type with equivalent dimensions (i.e. with identical longitudinal and transverse spatial extensions).

According to another possible feature, the elementary microstructure has a longitudinal dimension comprised between about 5 and 200 µm (or microns), the longitudinal dimension preferably being comprised between 50 and 100 µm, and a transverse dimension comprised between about 2 and 10 µm.

According to another possible feature, the elementary microstructures of the substrate are arranged periodically over said substrate.

According to another possible feature, the elementary microstructures of the substrate have a spatial period SP comprised between 3 and 10 µm.

According to another possible feature, two consecutively placed elementary microstructures of the substrate are spaced apart from each other by a distance comprised between about 0.5 and 10 µm and preferably comprised between 0.5 and 2 µm.

According to another possible feature, the open cavity of each of the elementary microstructures extends longitudinally inside said elementary microstructure.

Thus, the elementary microstructures are substantially the shape of a microtube (or even the shape of a micropillar that is at least partially hollowed out along its length).

The longitudinal extension of the cavity allows the surface area of the microstructured substrate to be increased.

According to another possible feature, the elementary microstructure has an aspect ratio higher than or equal to 10 and preferably comprised between 10 and 100.

According to another possible feature, the microstructured substrate is made from a material chosen from silicon, silicon dioxide, gallium arsenide, silicon nitride and indium phosphide.

According to another possible feature, said elementary microstructures are made from silicon.

According to another possible feature, the microstructured substrate and the plurality of elementary microstructures form a single object (i.e. the microstructured substrate and the plurality of elementary microstructures are formed integrally from the same material), for example made of silicon.

The second subject of the present invention is a process for obtaining a microstructured substrate such as defined above by microstructuring a substrate having a planar surface, characterized in that it includes at least the following steps:
  a) a step of coating a photoresist layer onto the planar surface of said substrate;
  b) a step of producing by photolithography a repetition of at least one elementary pattern in the photoresist layer in order that the surface of the substrate presents zones exempt from photoresist;
  c) a step of etching the zones of the surface of the substrate exempt from photoresist, the zones covered with photoresist for their part being protected;
  d) a step of passivating the surface of the substrate;
  e) a step of repeating the etching and passivating steps c) and d) in order to obtain said microstructured substrate, and, subsequently to the repeating step e), a step of depositing alumina on the surface of the microstructured substrate.

According to one possible feature, the etching and passivating steps are carried out by way of ionized gas.

For the photolithography step, the elementary pattern playing the role of mask during the etching step advantageously has an annular shape the dimensions (inside and outside diameters) of which coincide with the cross section and transverse dimensions SP, FP and ID of the elementary microstructure: it will thus have a circular annular shape in order to obtain microtubes with a circular cross section after the etching step, or a square annular shape in order to obtain microtubes with a square cross section. The term "annular" is understood to mean any geometric shape apertured in its centre.

Thus, the elementary pattern obtained in the photolithography step b) may have an annular shape the dimensions of which coincide with the transverse dimensions SP, FP, ID of the elementary microstructure.

For the etching step, the ionized gas is preferably chosen from the following ionized gases: carbon tetrafluoride, sulphur hexafluoride, methane, dihydrogen, dichlorine, hydrogen bromide, boron trichloride, silicon tetrachloride and one of their mixtures.

For the passivating step, the ionized gas is for example octafluorocyclobutane.

The conformal deposition of an alumina layer allows inter alia the microstructured substrate to be electrically insulated and asperities on the surface of the microstructures to be decreased.

The present invention also relates to the use of a structured substrate such as defined above to produce a device for storing electrical energy and more particularly an all-solid-state electrochemical battery.

Thus, another subject of the present invention is a device for storing electrical energy including a microstructured substrate according to the invention.

Specifically, the substrates may for example be used as carriers in the manufacture of all-solid-state batteries. An all-solid-state battery is a battery in which the electrodes and electrolyte are solid compounds.

It is then advantageous for the substrate to be microstructured so as to optimize the operation of the all-solid-state battery of which it is the carrier.

For this purpose, the invention relates to a device for storing electrical energy including at least:
  a substrate,
  a negative electrode and a positive electrode, one of which is placed on the substrate, and
  an electrolyte placed between the negative electrode and the positive electrode,
  characterized in that the substrate is a microstructured substrate such as defined above.

It will be noted that depending on the electrode materials, the electrical battery may include one or more current collectors.

The device may furthermore comprise a first current collector placed on the substrate and a second current collector, the negative electrode and the positive electrode being placed between the first and second current collectors.

The substrate may be made from a material chosen from silicon, silicon dioxide, gallium arsenide, silicon nitride and indium phosphide and the current collectors may be made from solid materials chosen from aluminium, copper, platinum and titanium nitride.

According to another possible feature, the negative-electrode materials are chosen from carbon (for example in the form of graphite), titanium dioxide (or $TiO_2$), lithium titanate (or $Li_4Ti_5O_{12}$), silicon (or Si), germanium (or Ge) and the transition metals (Au, Ag, Pt, etc.).

According to another possible feature, the positive-electrode materials are chosen from lamellar oxides of lithium and transition metals, lithium spinels, chemical compounds of general formula $LiMPO_4$ (M representing at least one element chosen from the transition metals), polyanionic compounds such as fluorosulphates and fluorophosphates of lithium and transition metals and sulphates of lithium and transition metals.

According to another possible feature, the electrolyte comprises a lithium salt chosen from lithium orthophosphate (or $Li_3PO_4$), lithium phosphide oxynitride (or LiPON), lanthanum and/or lithium titanates, lithium bis(oxalato)borate (or LiBOB) and lithium bis(trifluoro-methanesulfonyl) imide (or LiTFSI), in solution in a solvent.

According to another possible feature, said current collectors are made from solid materials such as aluminium, copper, platinum and titanium nitride.

According to another possible feature, the negative electrode, the positive electrode and the electrolyte each take the form of a thin layer.

The negative and positive electrodes and the electrolyte each have a thickness comprised between 15 and 200 nm (or nanometers).

According to another possible feature, said at least two current collectors each take the form of a thin layer having a thickness comprised between 25 and 50 nm.

BRIEF DESCRIPTION OF THE DRAWINGS

The invention will be better understood, and other aims, details, features and advantages thereof will become more clearly apparent, from the following description of particular embodiments and exemplary embodiments of the invention, which description is given merely by way of nonlimiting illustration and with reference to the appended drawings, in which:

FIG. 1b is a top view of the microstructured substrate in FIG. 1a;

FIG. 1c is an enlarged top view of two types of elementary microstructure placed on the microstructured substrate in FIG. 1a;

FIG. 5a shows a schematic perspective top and partial cutaway view of a device for storing electrical energy according to the invention;

FIG. 5b is an enlarged schematic transverse cross-sectional view of the constituent elements of said device for storing electrical energy in FIG. 5a.

DETAILED DESCRIPTION

Figure 1A:
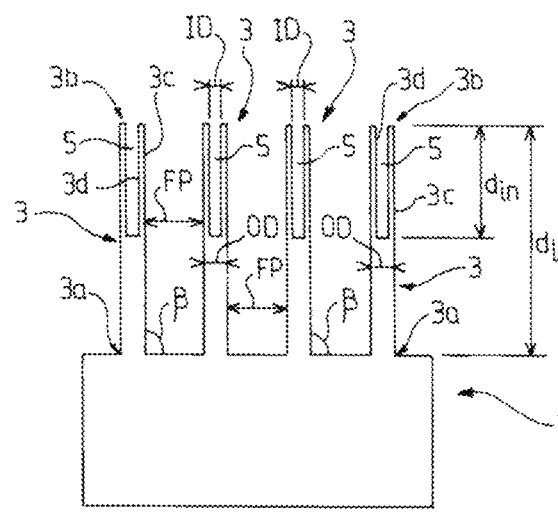
FIG. 1a shows a very schematic longitudinal cross-sectional view of a microstructured substrate according to the invention.

FIG. 1a shows a very schematic longitudinal cross-sectional view of a microstructured substrate 1 according to the invention including a plurality of elementary microstructures 3.

The substrate is, in the embodiment shown, a silicon wafer that has a substantially planar surface and a substantially constant thickness.

Said elementary microstructure 3 has an elongate shape and two opposite longitudinal ends, namely a lower end 3a and an upper end 3b.

The elementary microstructure 3 is connected to the substrate 1 by way of its lower end 3a and extends away from the surface of said substrate 1. The upper end 3b of the elementary microstructure 3 is free. In addition, the longitudinal axis of said elementary microstructure 3 is substantially orthogonal to the main plane of extension of said substrate 1.

Moreover, the elementary microstructure 3 includes an open cavity 5 at the upper end 3b of said microstructure 3.

It will be noted that the elementary microstructure 3 has an external face 3c that delimits the exterior outline of the microstructure 3 and an internal face 3d that delimits said cavity 5.

More particularly, the open cavity 5 extends longitudinally inside said elementary microstructure 3. The cavity 5 is characterized by a longitudinal dimension $d_{in}$ comprised between 5 and 50 µm. The elementary microstructure 3 is characterized by a distance between the lower and upper end of the elementary microstructure that corresponds to the longitudinal dimension $d_L$ of the elementary microstructure 3. The longitudinal dimension $d_L$ of the elementary microstructure is comprised between 10 and 200 µm.

It will be noted that the longitudinal dimension $d_{in}$ of the cavity 5 is substantially equal to half the longitudinal dimension $d_L$ of the elementary microstructure 3.

The elementary microstructure 3 is also characterized by a transverse dimension OD that corresponds to the maximum spatial extension of the elementary microstructure 3 in a plane orthogonal to the longitudinal axis of said microstructure 3. The transverse dimension OD of the elementary microstructure is comprised between 2 and 10 µm.

It will be noted that said elementary microstructures 3 are arranged, on the one hand, substantially parallel to one another and, on the other hand, so as to make relative to the main plane of extension of the substrate 1 an angle β that is substantially right.

The expression "an angle that is substantially right" is understood to mean an angle comprised between about 88° and 92°.

Said microstructures 3 are spaced apart from one another by a distance FP comprised between about 0.5 and 10 µm and preferably comprised between 1 and 2 µm.

It will also be noted that the elementary microstructure may for example have a circular, elliptical, rectangular, square or triangular transverse cross section.

Figure 1B:
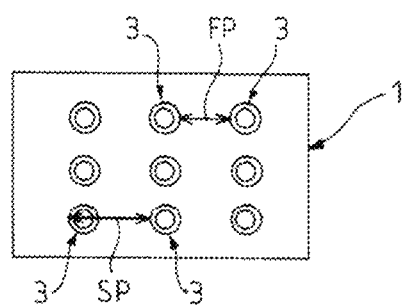

As illustrated in FIG. 1b, said elementary microstructures 3 are arranged periodically over the substrate 1. The spatial period SP of the elementary microstructures 3 is for example comprised between 3 and 10 µm.

The spatial period SP is also equal to the sum of the transverse dimension OD of a microstructure 3 and the space (corresponding to the distance FP) separating two consecutively placed microstructures 3.

Figure 1C:
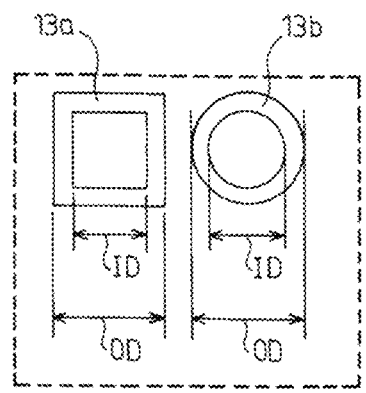

FIG. 1c for its part is a schematic top view of elementary microstructures 13a, 13b having square and circular transverse cross sections, respectively.

Thus, each of the elementary microstructures 3, 13a, 13b is also characterized by a transverse dimension ID corresponding to the maximum transverse spatial extension ID of the cavity 5 of the elementary microstructure 3.

The elementary microstructure may thus be defined by an aspect ratio $r_{asp}$ that is the ratio of the longitudinal dimension $d_L$ to the distance FP separating two consecutive elementary microstructures 3. The aspect ratio of an elementary microstructure 3, 13a, 13b is for example higher than or equal to 10 and is preferably comprised between 10 and 100.

Figure 1D:
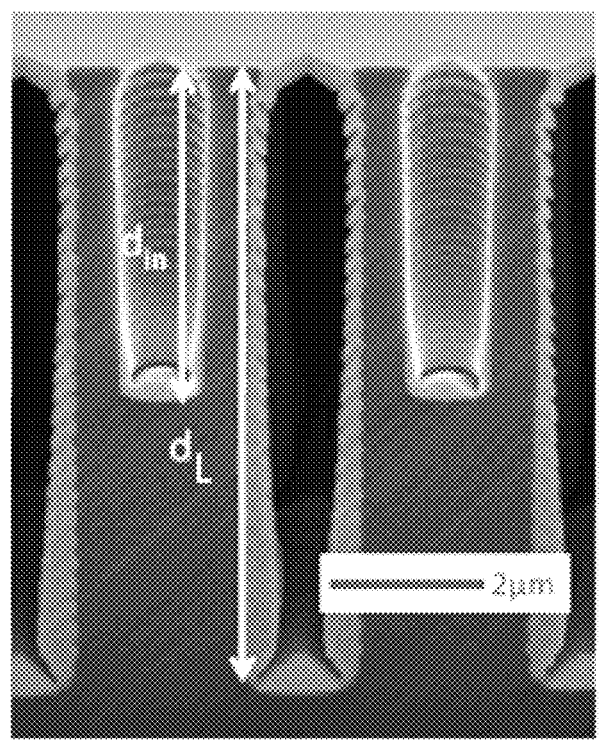
FIG. 1d is a cross-sectional photograph of one portion of a microstructured substrate according to the invention.

FIG. 1d is a cross-sectional photograph of a microstructured substrate 1 according to the invention that includes two elementary microstructures 3. FIG. 1d is a photograph taken by a scanning electron microscope sold under the trade name Zeiss Ultra 55®.

The elementary microstructures 3 in FIG. 1d have the following characteristic sizes:
  a longitudinal dimension $d_1$ of 10 µm;
  a transverse dimension OD of 3 µm;
  a longitudinal dimension $d_{in}$ of the cavity 5 of 5 µm;
  a transverse dimension ID of the cavity 5 of 1 µm; and
  a spatial period SP of 4 µm (it will therefore be noted that the distance FP separating two consecutively placed microstructures is 1 µm).

Figure 4A:
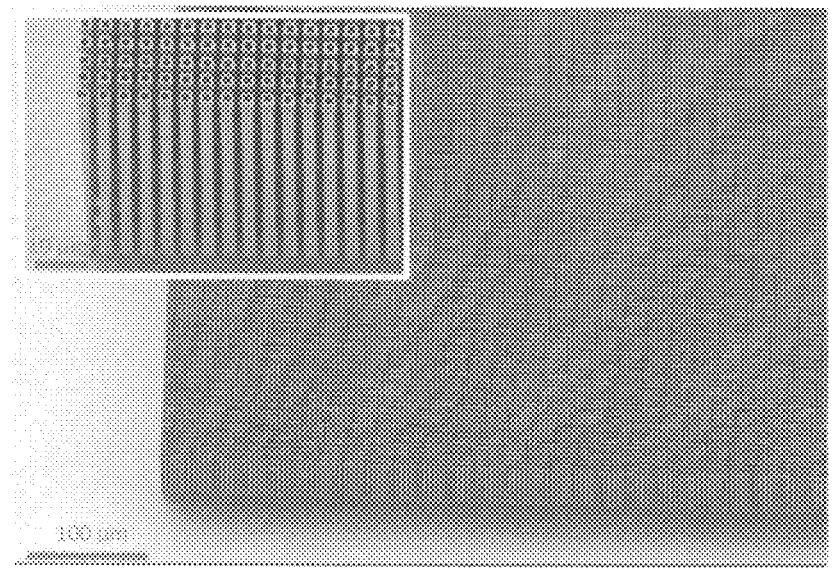
FIGS. 4a and 4b are photographs at various magnifications of a microstructured substrate according to the invention.
Figure 4B:
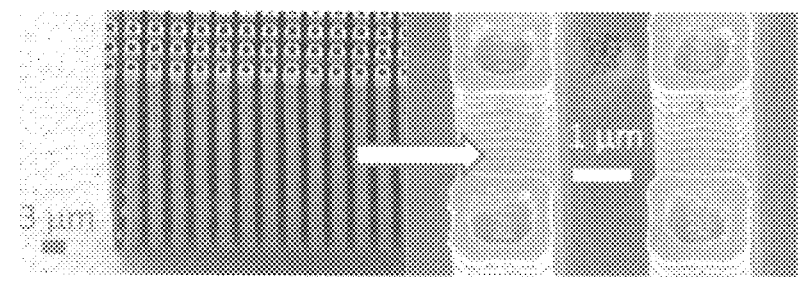

The appended FIGS. 4a and 4b are photographs of observations at various magnifications of a microstructured substrate according to the invention. The photographs in FIGS. 4a and 4b were taken with a scanning electron microscope sold under the trade name Zeiss Ultra 55®.

Elementary microstructures of square cross section arranged periodically over a silicon substrate may be seen.

The characteristic sizes of the microstructured substrate of FIGS. 4a and 4b are the following:
  a longitudinal dimension $d_L$ of 30 µm;
  a transverse dimension OD of 2 µm;
  a longitudinal dimension $d_{in}$ of the cavity 5 of 15 µm;

a transverse dimension ID of the cavity 5 of 1.2 µm; and a spatial period SP of 4 µm (it will therefore be noted that the distance FP separating two consecutively placed microstructures is 2 µm).

It will be noted that the microstructured substrate and its microstructures may also be produced in a material chosen from silicon dioxide, gallium arsenide, silicon nitride and indium phosphide.

The microstructured substrate and the plurality of elementary microstructures form a single object (i.e. the microstructured substrate and the plurality of elementary microstructures are formed integrally from the same material).

Nevertheless, in one variant embodiment, the substrate and the microstructures may be produced from different materials.

It will in addition be noted that in another variant embodiment, the elementary microstructure is produced from a material chosen from silicon dioxide, gallium arsenide, indium phosphide and one of their mixtures.

The microstructured substrate 1 according to the invention is obtained by an obtaining process that is described below.

The process for obtaining a microstructured substrate according to the invention includes the following steps:
a) A step of cleaning a silicon substrate or wafer using methods known per se and that therefore will not be detailed further here.
b) A step of coating a layer of photoresist of uniform thickness onto the plane surface of the silicon wafer. More particularly, the photoresist layer is deposited by spin coating. By way of example, it is especially possible to use the photoresist sold under the name SPR® 220 by Rohm and Haas® or the photoresist sold under the name AZ9260® by Microchemicals GmbH.
c) A step of producing by photolithography a repetition of at least one elementary pattern in the photoresist layer in order that the surface of the substrate presents zones exempt from photoresist.

The step of producing by photolithography a plurality of at least one elementary pattern is a method known per se and will therefore not be detailed further here.

The appended FIGS. 2a to 3b are photographs obtained by a Zeiss Ultra 55® scanning electron microscope and in which a plurality of elementary patterns produced in photoresist may be seen.

Figure 2A:
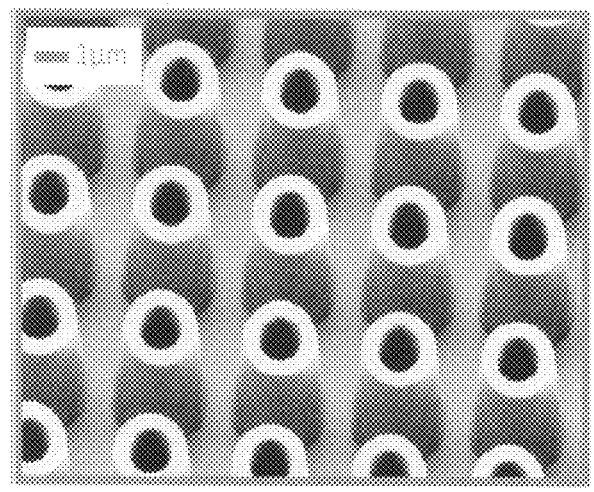
FIGS. 2a, 2b, 3a and 3b are photographs of patterns obtained in the photolithography step according to the invention.
Figure 2B:
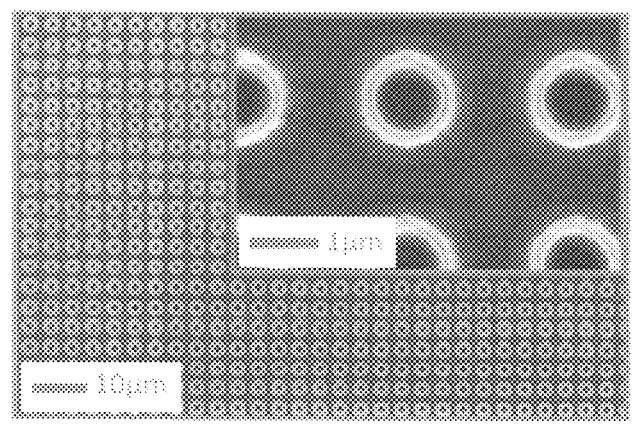

The elementary patterns in FIGS. 2a and 2b are substantially the shape of a tube with a circular cross section.

Figure 3A:
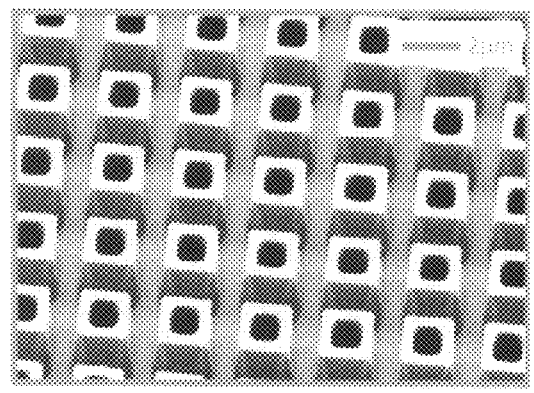
Figure 3B:
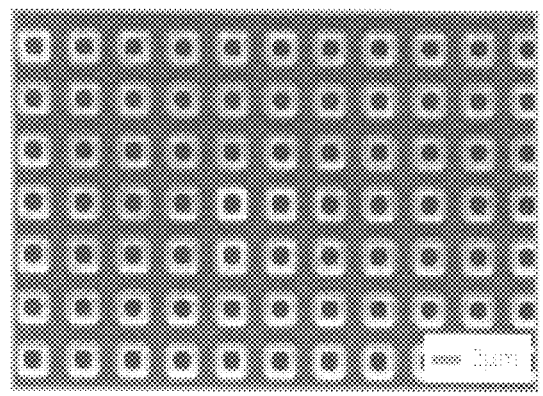

The elementary patterns in FIGS. 3a and 3b are substantially the shape of a tube of square cross section.

d) A step of etching the zones of the substrate exempt from photoresist. The etching step is carried out by a Bosch-type deep reactive ion etching (DRIE) technique using an ionized gas such as sulphur hexafluoride (or $SF_6$). The silicon substrate is etched at a rate of 3 µm/m and the duration of the etching step is about 3 seconds.
e) A step of passivating the surface of the substrate (the passivating is a selective process that occurs preferentially on the zones of the substrate exempt from photoresist). The passivating step is carried out by a Bosch-type deep reactive ion etching (DRIE) technique using an ionized gas such as octafluorobutene ($C_4F_8$). The duration of the passivating step is about 2 seconds.
f) A step of repeating said etching and passivating steps in order to obtain said microstructured substrate.

It will be noted that the etching and passivating steps are carried out using a plasma etching tool from SPTS®.

The repetition of the etching and passivating steps allows elementary microstructures having a high aspect ratio, for example higher than or equal to 10 and preferably comprised between 10 and 100, to be obtained. In addition, the elementary microstructures thus obtained extend away from and orthogonally to the main plane of extension of the substrate.

g) A step of removing the photoresist carried out by a plasma surface treatment technique by way of a machine sold under the name Ashing System GIGAbatch 310 M by PVA TEPLA®.

It will be noted that this manufacturing technique produces elementary microstructures having irregularities such as scallops on their surface (more particularly visible in FIGS. 1d and 4b).

In a variant embodiment (not shown), the step g) of removing the photoresist is followed by a step of depositing alumina (or $Al_2O_3$) on the surface of the obtained elementary microstructures. The step of depositing alumina is carried out by an atomic layer deposition (or ALD) process and allows a conformal layer of alumina to be deposited on the interior and exterior of the elementary microstructures.

This alumina layer at least partially fills the scallops produced by the process for obtaining the microstructured substrate according to the invention in order to facilitate the subsequent deposition of other materials on the surface of the microstructured substrate and to electrically insulate the microstructured substrate according to the invention.

The last subject of the present invention is a device for storing electrical energy, for example an electrical battery, and more particularly an all-solid-state electrochemical battery 41, that includes a microstructured substrate 43 according to the invention.

Figures 5A, 5B:
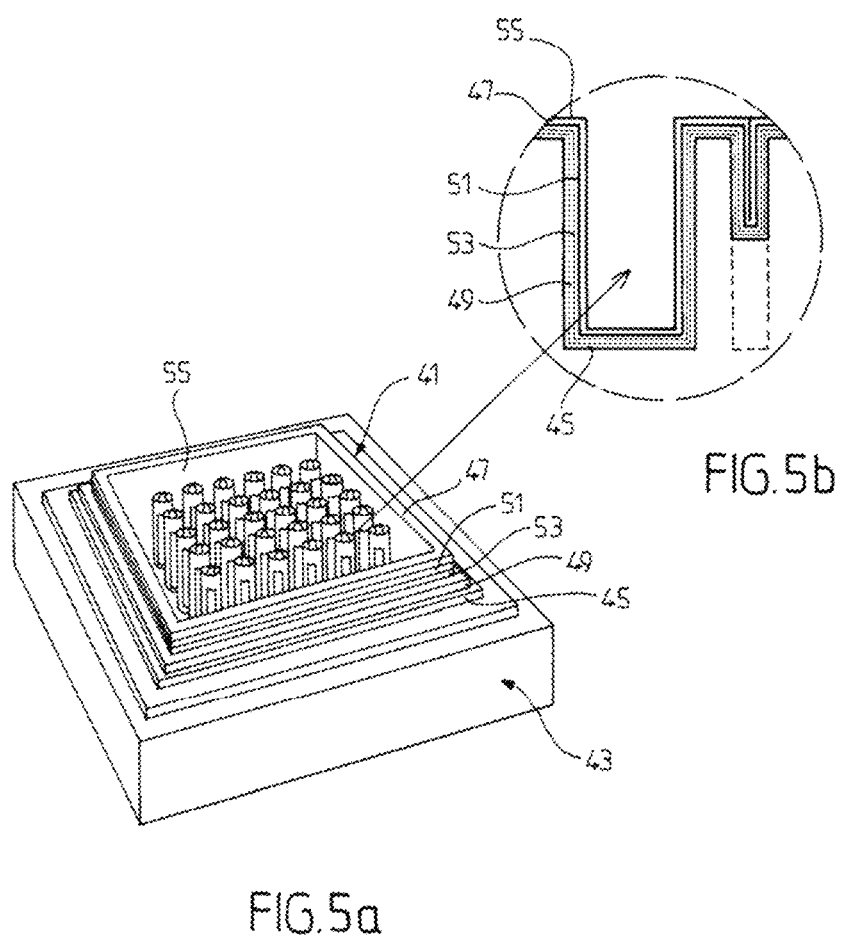

FIG. 5a is a schematic perspective top and partial cutaway view of an electrochemical battery 41 according to the invention.

Said battery 41 includes:
a first current collector 45 placed on the microstructured substrate 43;
a second current collector 47;
a negative electrode 49 and a positive electrode 51, which electrodes are placed between the first and second current collectors 45, 47; and
an electrolyte 53 placed between the negative electrode 49 and the positive electrode 51.

The above elements 45 to 53 take the form of a stack of thin layers produced from solid materials.

The current collectors are for example produced from solid materials such as aluminium, copper, platinum and titanium nitride.

In addition, a protective layer 55 for example of silicon nitride or of silicon oxide is deposited on the surface of the stack of thin layers 45 to 53 in order to protect the latter from oxidation.

As illustrated in FIG. 5b, the microstructured substrate according to the invention allows said thin layers 45 to 53 to be deposited on the entirety of the surface of the substrate 43. The microstructured substrate 43 according to the invention is able to accommodate a larger quantity of electrode materials while exhibiting good mechanical qualities. Thus, the battery 41 according to the invention has a better performance than prior-art batteries.

It will be noted that the thin layers 45 to 53 are produced using at least one of the following methods: atomic layer deposition (or ALD), molecular beam epitaxy (MBE), chemical vapour deposition (CVD), physical vapour deposition (PVD), electrodeposition, etc.

By way of example, FIGS. 6a to 6d illustrate characteristic properties of electrochemical half-cells including a microstructured substrate according to the invention and/or an electrochemical half-cell including a planar substrate.

The electrochemical half-cells each include a thin layer of 30 nm of platinum forming a current collector and a thin layer of titanium dioxide (in anatase crystalline form) forming a negative electrode that has a thickness comprised between 38 nm and 150 nm.

The electrochemical half-cells were tested with a liquid electrolyte that was a mixture of lithium bis(trifluoro-methanesulfonyl)imide (or LiTFSI) of 1M concentration, of ethylene carbonate and diethylene carbonate (in identical proportions by volume). In addition, these half-cells were each tested with a lithium electrode, the lithium electrode playing the role of counter electrode and of reference electrode in the electrochemical cell thus formed (redox couple Li/Li$^+$).

The various electrochemical half-cells S0 to S3 tested included substrates having the properties presented in table 1 below:

TABLE 1

|    | OD (μm) | ID (μm) | SP (μm) | $d_L$ (μm) | $d_{in}$ (μm) |
|----|---------|---------|---------|------------|---------------|
| S0 | 0       | 0       | 0       | 0          | 0             |
| S1 | 3       | 0       | 4       | 9.1        | 0             |
| S2 | 2.02    | 1.25    | 4.04    | 27.6       | 13.8          |
| S3 | 2       | 1.5     | 4       | 45         | 22.5          |

The electrochemical half-cells S0 and S1 respectively include a planar substrate and a microstructured substrate in which the elementary microstructures are pillars.

The electrochemical half-cells S2 and S3 include, for their part, a microstructured substrate according to the invention.

It will therefore be noted that the microstructured substrate according to the invention allows devices for storing electrical energy to be manufactured that comprise a larger amount of active materials in each of the constituent elements (for example: electrolyte, electrodes, etc.) of a device for storing electrical energy.

The results of the characteristic quantities measured for the electrochemical half-cells are therefore illustrated in FIGS. 6a to 6d.

Figure 6A:
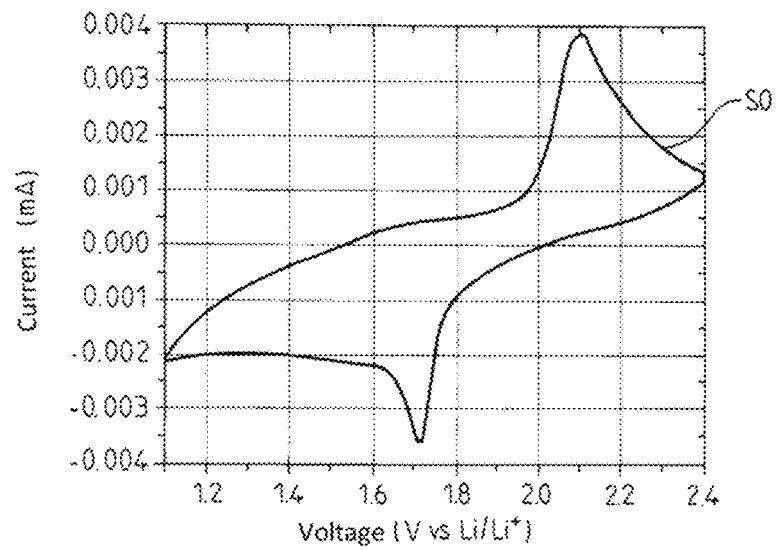
FIGS. 6a to 6d show graphs illustrating the performance of a battery according to the invention.

FIG. 6a shows the magnitude of the current in mA (or milliamps) delivered by the electrochemical half-cell S0 including a planar substrate as a function of the voltage in V (or volts) applied across the terminals of the electrochemical cell formed.

Figure 6B:
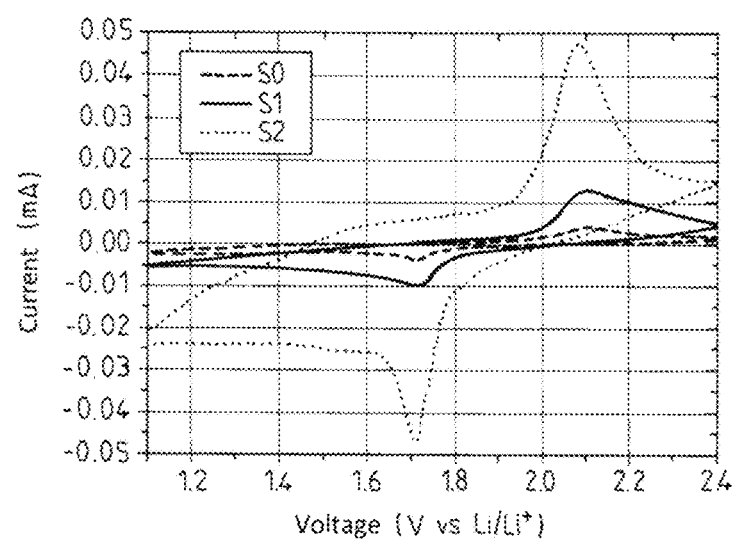

FIG. 6b shows the magnitude of the current in mA delivered by the electrochemical cells S0, S1 and S2 as a function of the voltage in V (or volts) applied across the terminals of said formed electrochemical cells.

It may be seen that the maximum magnitude of the current delivered by the cell including the microstructured substrate according to the invention S2 is:
  at least 10 times higher, at identical voltage, than the magnitude of the current delivered by the cell S0 including a planar substrate; and
  at least 4 times higher, at identical voltage, than the magnitude of the current delivered by the cell S1 including a microstructured substrate.

Figure 6C:
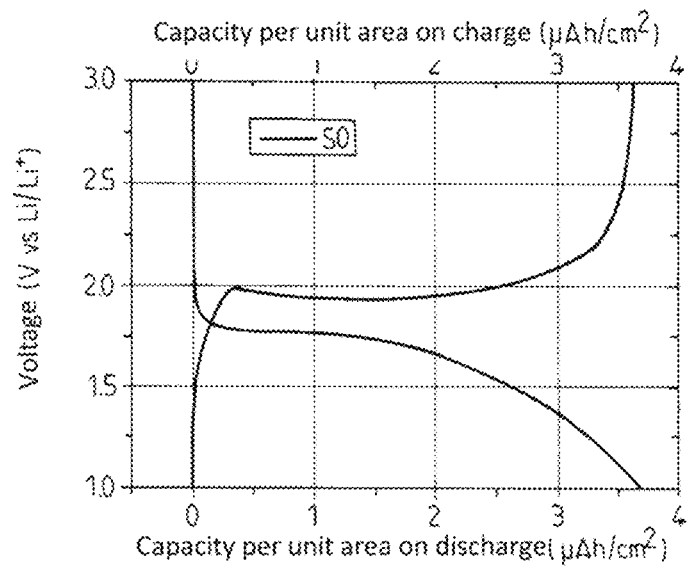

FIG. 6c shows the capacity per unit area in μAh/cm$^2$ (or microamp-hours per centimeter squared) during a charge and during a discharge of the electrochemical cell S0 including a planar substrate, as a function of a voltage in V applied across the terminals of said cell.

Figure 6D:
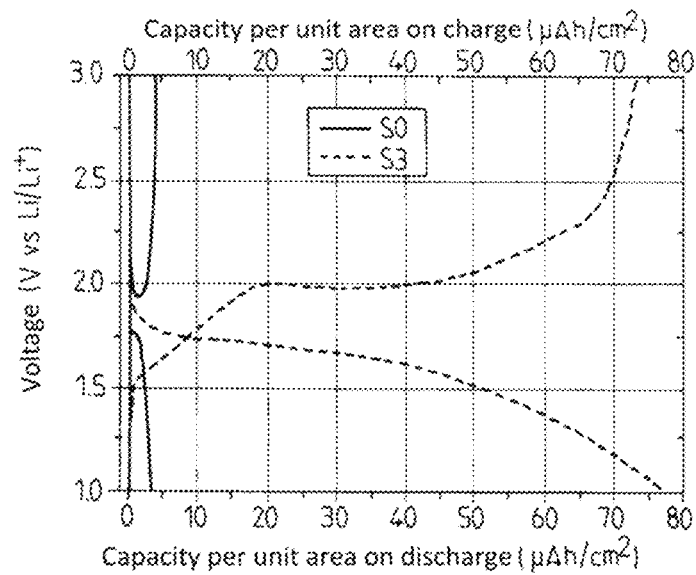

FIG. 6d shows the capacity per unit area in μAh/cm$^2$ during a charge and during a discharge of the electrochemical cell S3 including a microstructured substrate according to the invention, as a function of a voltage in V applied across the terminals of said cell.

FIG. 6d also includes the results illustrated in FIG. 6c for the electrochemical cell including a planar substrate.

It may be seen that the maximum values of the capacity per unit area of the cell including a microstructured substrate according to the invention, whether this is during the charge or discharge of the electrochemical cell, are at least 20 times higher than the maximum values of the capacity per unit area of the electrochemical cell including a planar substrate.

It will be noted that the results illustrated in FIGS. 6a-b were obtained with a voltage scanning speed of 0.15 mV/s.

FIGS. 6a to 6d therefore clearly illustrate the fact that the device for storing electrical energy according to the invention allows a better performance to be obtained than prior-art devices for storing electrical energy.

The invention claimed is:

1. A microstructured substrate comprising:
   a plurality of at least one elementary microstructure,
   wherein said at least one elementary microstructure, on the one hand, has an elongated shape having a longitudinal dimension ($d_L$) and lower and upper opposite longitudinal ends, the lower end being connected to a surface of a substrate and, on the other hand, includes an open cavity at its upper end, said open cavity having a longitudinal dimension ($d_{in}$) and extending longitudinally inside said at least one elementary microstructure,
   said at least one elementary microstructure has an external face that delimits the exterior outline of said at least one elementary microstructure and an internal face that delimits said cavity,
   said microstructured substrate having a conformal layer of alumina deposited directly on the surface of the substrate located at the exterior outline of said at least one microstructure, on the external face of said at least one elementary microstructure and on the internal face of said cavity,
   wherein the longitudinal dimension ($d_{in}$) of the open cavity is substantially equal to half the longitudinal dimension ($d_L$) of said at least one elementary microstructure.

2. The microstructured substrate according to claim 1, wherein said at least one elementary microstructure has a circular, elliptical, rectangular, square or triangular transverse cross section.

3. The microstructured substrate according to claim 1, wherein said at least one elementary microstructure has a longitudinal dimension ($d_L$) between 5 and 200 μm and a transverse dimension (OD) between 2 and 10 μm.

4. The microstructured substrate according claim 1, wherein said at least one elementary microstructures of the substrate are arranged periodically over said substrate.

5. The microstructured substrate according to claim 4, wherein said at least one elementary microstructures of the substrate have a spatial period (SP) between 3 and 10 μm.

6. The microstructured substrate according to claim 1, wherein said at least one elementary microstructure has an aspect ratio ($r_{asp}$) higher than or equal to 10.

7. The microstructured substrate according to claim 1, wherein said substrate is made from a material chosen from silicon, silicon dioxide, gallium arsenide, silicon nitride and indium phosphide.

8. A process for obtaining a microstructured substrate according to claim 1 by microstructuring a substrate having a planar surface, said process comprising the steps of:
   a) coating a photoresist layer onto the planar surface of said substrate,
   b) producing by photolithography a repetition of at least one elementary pattern in the photoresist layer in order that the surface of the substrate presents zones exempt from photoresist, said at least one elementary pattern having an elongated shape having a longitudinal dimension ($d_L$) and a lower and an upper opposite longitudinal ends, the lower end being connected to the surface of the substrate and, on the other hand, includes an open cavity having a longitudinal dimension ($d_{in}$) at its upper end, the longitudinal dimension ($d_{in}$) of said open cavity being substantially equal to half the longitudinal dimension ($d_L$) of said at least one elementary pattern, said at least one elementary pattern has an external face that delimits the exterior outline of said at least one elementary pattern and an internal face that delimits said cavity,
   c) etching the zones of the surface of the substrate exempt from photoresist,
   d) passivating the surface of the substrate,
   e) repeating said etching and passivating steps c) and d), and
   f) depositing a conformal layer of alumina directly on the surface of the surface of the substrate located at the exterior outline of said at least one elementary pattern, on the external face of said at least one elementary pattern and on the internal face of said cavity.

9. The process according to claim 8, wherein said at least one elementary pattern obtained in the photolithography step b) has an annular shape presenting transverse dimensions comprised between 2 to 10 μm.

10. The process according to claim 8, wherein the etching and passivating steps c) and d) are carried out by way of an ionized gas.

11. The microstructured substrate as defined in claim 1, wherein said microstructured substrate is configured for application within a device for storing electrical energy.

12. A device for storing electrical energy having a microstructured substrate according to claim 1, said device comprising:
   a substrate,
   a negative electrode and a positive electrode, one of which is placed on the substrate, and
   an electrolyte placed between the negative electrode and the positive electrode.

13. The device according to claim 12, wherein said device further comprises a first current collector placed on the substrate and a second current collector, the negative electrode and the positive electrode being placed between the first and second current collectors.

14. The device according to claim 13, wherein the substrate is made from a material chosen from silicon, silicon dioxide, gallium arsenide, silicon nitride and indium phosphide, wherein the first and second current collectors are each made from solid materials chosen from aluminium, copper, platinum and titanium nitride.

15. The device for storing electrical energy according to claim 12, wherein the negative electrode, the positive electrode and the electrolyte are each formed as a layer having a thickness between 15 nm and 200 nm.

* * * * *